United States Patent [19]

Berger et al.

[11] Patent Number: 4,797,546

[45] Date of Patent: Jan. 10, 1989

[54] METHOD FOR READING A LIGHT-SENSITIVE ELEMENT CONSTITUTED BY A PHOTODIODE AND A CAPACITOR

[75] Inventors: Jean L. Berger; Marc Arques, both of Grenoble, France

[73] Assignee: Thomson-CSF, Paris, France

[21] Appl. No.: 3,890

[22] Filed: Jan. 16, 1987

[30] Foreign Application Priority Data

Jan. 17, 1986 [FR] France .................... 86 00656

[51] Int. Cl.$^4$ .................. H01J 40/14; H04N 3/14
[52] U.S. Cl. ..................... 250/214 R; 250/578; 358/213.28
[58] Field of Search ............ 250/578, 214 RC, 214 R, 250/211 J; 358/213.28, 213.31, 213.19; 357/30–32

[56] References Cited

U.S. PATENT DOCUMENTS

| | | | |
|---|---|---|---|
| 3,536,830 | 10/1970 | Hakki | 358/213.31 |
| 3,540,011 | 11/1970 | Stupp et al. | 358/213.31 |
| 4,495,409 | 1/1985 | Baji et al. | 250/211 J |
| 4,605,969 | 8/1986 | Green | 250/578 |

FOREIGN PATENT DOCUMENTS

0046396  2/1982  European Pat. Off. .
1258572 12/1971  United Kingdom ................ 250/578

OTHER PUBLICATIONS

C. Anagnostopoulos, "Signal Readout in CID Image Sensors", IEEE Transactions on Electron Devices, vol. ed. 25, No. 2, 2/78, pp. 85–89.

IEEE Transactions on Nuclear Science, vol. 19, No. 3, Jun. 1972, pp. 418–422, R. Kurz, "Low-noise Preamplifier for High Court".

B. B. Baker, "Photodiode Array Noise Compensation Circuit," IBM Technical Disclosure Bulletin, vol. 17, No. 11, Apr. 1975, pp. 3321–3322.

*Primary Examiner*—David C. Nelms
*Assistant Examiner*—Michael Messinger
*Attorney, Agent, or Firm*—Pollock, VandeSande & Priddy

[57] ABSTRACT

A method for reading a photosensitive element having a photodiode and a capacitor as applicable in particular to reading a low-level analog signals consists in introducing a biasing charge background, for example by means of calibrated uniform illumination prior to each read operation in order to cause forward biasing of the photodiode substantially beyond its knee voltage at the time of application of a control read pulse which reliably restores the voltage at the photodiode terminals to the knee voltage value, the current during the read operation being such that all the charges are then reliably transmitted via the capacitor to the integrating read amplifier.

5 Claims, 4 Drawing Sheets

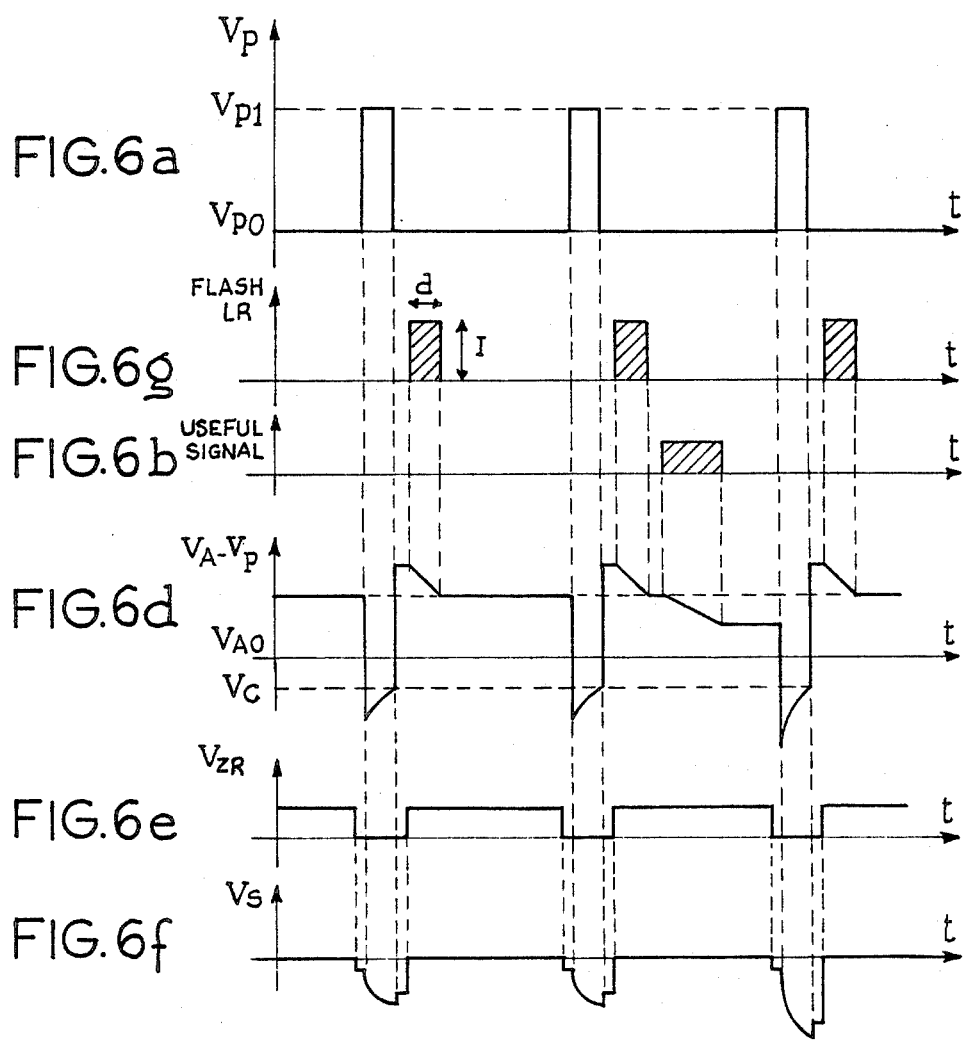

METHOD FOR READING A LIGHT-SENSITIVE ELEMENT CONSTITUTED BY A PHOTODIODE AND A CAPACITOR

BACKGROUND OF THE INVENTION

1. Field of the Invention

This invention relates to the field of reading of light-sensitive nodes which are mainly provided with a photodiode.

2. Description of the Prior Art

Reading of light-sensitive nodes at which provision is made for a photodiode is usually carried out in the prior art by means of switching elements which control the read operation.

In order to simplify the manufacturing processes, attention can be directed to structures of light-sensitive elements in which no switching element is provided. In this case, a signal in the form of pulses is employed for the read operation in order to control the discharge of a capacitor associated with the photodiode. This type of structure makes it possible to form matrices having large dimensions now that the techniques of thin-film deposition of amorphous silicon, for example, have been completely mastered.

When reading analog signals of small amplitude by means of matrices of this type, however, the charge stored within the light-sensitive elements is not completely read if the value of the conduction current is too low to permit removal of all the charges.

SUMMARY OF THE INVENTION

The invention is directed to a method for reading a light-sensitive element having a light-sensitive diode and a capacitor without any switching element, which permits reading of analog signals even of small amplitude.

In accordance with the invention, a method for reading a light-sensitive element having a photodiode and a capacitor in which the photodiode is reverse-biased during exposure to the useful radiation and is made conductive by means of periodic pulses during read intervals, is distinguished by the fact that, after each read pulse, a constant biasing-charge background is applied to the photodiode in order to cause forward biasing of the photodiode by the read pulses beyond its knee voltage irrespective of the useful signal and in order to produce a conduction current which is sufficient to ensure that the entire useful charge is read even when the useful signal is at a low level. Said charge background is obtained by restoring the voltage at the photodiode terminals to a predefined value prior to each exposure to the useful radiation.

BRIEF DESCRIPTION OF THE DRAWINGS

FIGS. 6a, 6b, 6d, 6e, 6f and 6g are signal diagrams providing an explanatory illustration of the method of reading in accordance with the invention and in a second alternative embodiment.

DESCRIPTION OF THE PREFERRED EMBODIMENTS

It was indicated earlier that one stage of the method of reading in accordance with the invention consists in superimposing a charge background on the useful signal in order to ensure that the diode is reliably forward-biased beyond its knee voltage at the time of application of the control read pulse even in the absence of a useful signal.

Three alternative embodiments of the method are conducive to the above-mentioned superimposition:

introduction in the read cycle of a level-restoring pulse which biases the diode beyond its reverse conduction threshold, followed by a "blank" reading stage;

uniform illumination of predetermined intensity and duration, which superimposes a calibrated charge background $Q_O$ on the charges corresponding to the useful signal $Q_S$;

or illumination by an intense light flash in order to introduce a charge background, followed by a "blank" read.

These three alternative embodiments make it possible in all cases to restore the voltage at the diode terminals to a predefined value.

The description which now follows will serve to gain a clearer understanding of the function performed by these different level-restoring means. There will first be described a method of pulsed reading of a photodiode through a capacitor without the improvement in accordance with the invention and with reference to FIGS. 1 and 2a to 2f.

Figure 1:
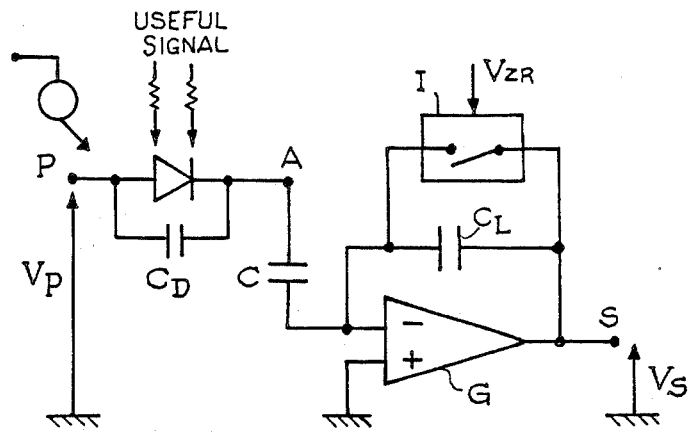
FIG. 1 illustrates the circuit components employed for reading a light-sensitive element constituted by a photodiode and a capacitor.

FIG. 1 illustrates the circuit components employed for reading a photodiode D which is connected between two nodes P and A and shown with its capacitor $C_D$ in parallel. Said diode D is placed in series with a capacitor C having a considerably higher value than $C_D$ (at least ten times the value). The other plate of capacitor C remains connected to ground by means of a differential amplifier G mounted as an integrator, the "+" input of which is connected to ground and the output of which is connected to its "−" input through a read capacitor $C_L$. A switch I controlled by pulses $V_{ZR}$ makes it possible to reset the integrator to zero.

The following description of the method of reading is given with reference to FIGS. 2a to 2f.

Figure 2A:
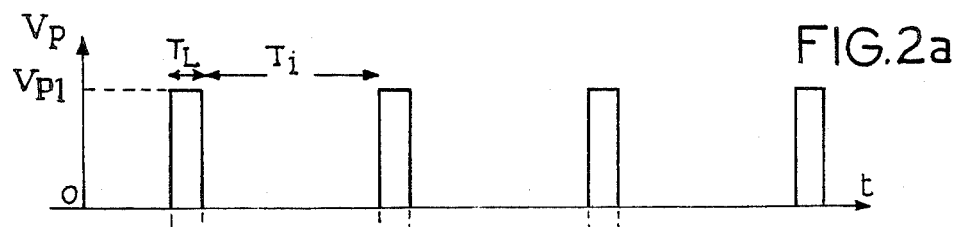
FIGS. 2a, 2b, 2c, 2d, 2e and 2f are signal diagrams providing an explanatory illustration of a reading method without the improvement in accordance with the invention.
Figure 2B:
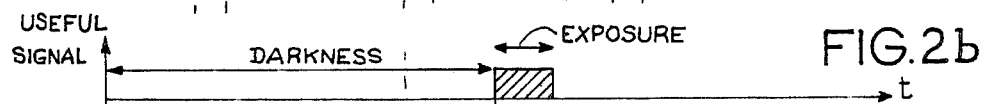
Figure 2C:
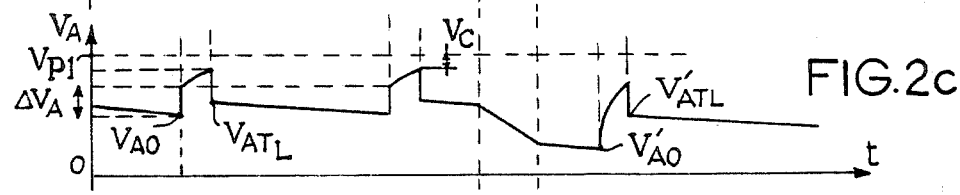

A read pulse $V_p$ having a level $V_{P1}$ and a time-duration $T_L$ as shown in FIG. 2a and applied to the diode D at the node P serves to charge the capacitor C and brings the voltage at the node A to a value close to the amplitude $V_{P1}$ of the applied pulse. At the instant corresponding to the trailing edge of said pulse, the capacitor C retains its charge and the diode D is therefore reverse-biased. This bias is maintained for a period of time $T_i$ during which the voltage $V_p$ at the node P is at the low level. During this period, the photodiode D is capable of receiving photons and consequently of discharging the capacitor C. FIG. 2b represents the useful-signal light flash. FIG. 2c represents the variation in voltage $V_A$ at the node A. $V_{AO}$ and $V'_{AO}$ are values of $V_A$ at the start of the read pulses and $V_{ATL}$ and $V'_{ATL}$ are values of $V_A$ at the end of the read pulses. The variation in voltage $V_A$, namely $\Delta V_A$, from leading edge to trailing edge of the read pulses corresponds to $$V_{P1} \cdot \frac{C_D}{C_D + C}.$$

Figure 2D:
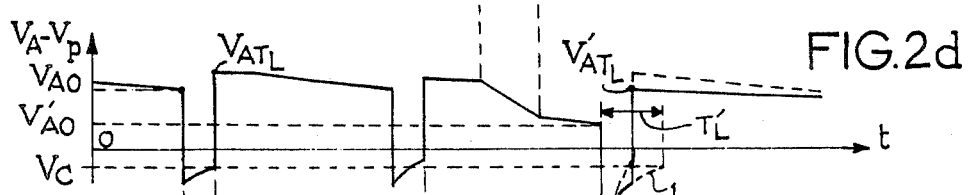
Figure 2E:
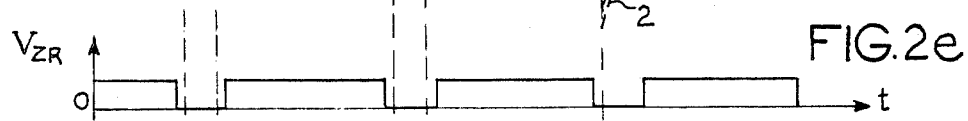
Figure 2F:
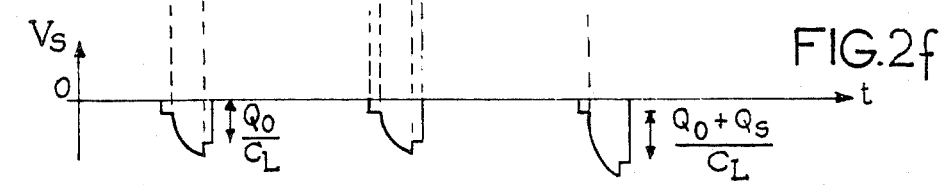

In FIG. 2d, $V_A - V_p$ is the voltage at the terminals of the diode. In FIG. 2e, $V_{ZR}$ is the control voltage for zero-reset of the integrator I. And in FIG. 2f, $V_s$ is the output voltage of said integrator.

At the following transition of the voltage $V_p$ to the high level $V_{P1}$, the capacitor C is recharged to its initial charge and the corresponding current is integrated by the read capacitor $C_L$ of the integrator. The integrator then delivers a signal voltage $\Delta V_s$ corresponding to the quantity of charges which is necessary in order to restore the initial charge:

$$\Delta V_s = \frac{I_{PH} \cdot T_i}{C_L},$$

where $I_{PH}$ is the photon current of the diode during the time interval $T_i$. The integrator is periodically reset to zero by a pulse $V_{ZR}$ which initiates closure of the switch for short-circuiting the capacitor $C_L$, the width of said pulse being slightly larger than that of the control pulses at the node P and being located on each side of these latter.

The potential of the node A which is common to the diode and to the capacitor varies progressively in time according to the charge and discharge of capacitor C. The voltage $V_A$ at the node A is brought during the time interval $T_L$ to a value which is close to the high level of $V_p$, and $(V_p - V_A)_{TL}$ at the end of the read pulse is equal to $V_C$. The voltage $V_C$ is the knee voltage of the diode, the value of which depends both on the read time $T_L$, on the capacitance C and on the saturation current. It is necessary for the purpose of efficient reading to ensure that the final voltage at the node A at the end of the read pulse and prior to the trailing edge of the voltage pulse $V_p$, or $V_{ATL}$, is not dependent on the values of initial voltage $V_{AO}$ at the time of application of the leading edge of the pulse at the node P. Provided that this condition is satisfied, the charge created by the useful signal is wholly transmitted to the read capacitor $C_L$. If this condition is not met, the read operation is incomplete as indicated earlier since the voltage at the terminals of the diode is not restored to the knee voltage $V_C$ of the diode.

Figures 3, 4, 5A, 5B, 5D, 5E, 5F, 5G:
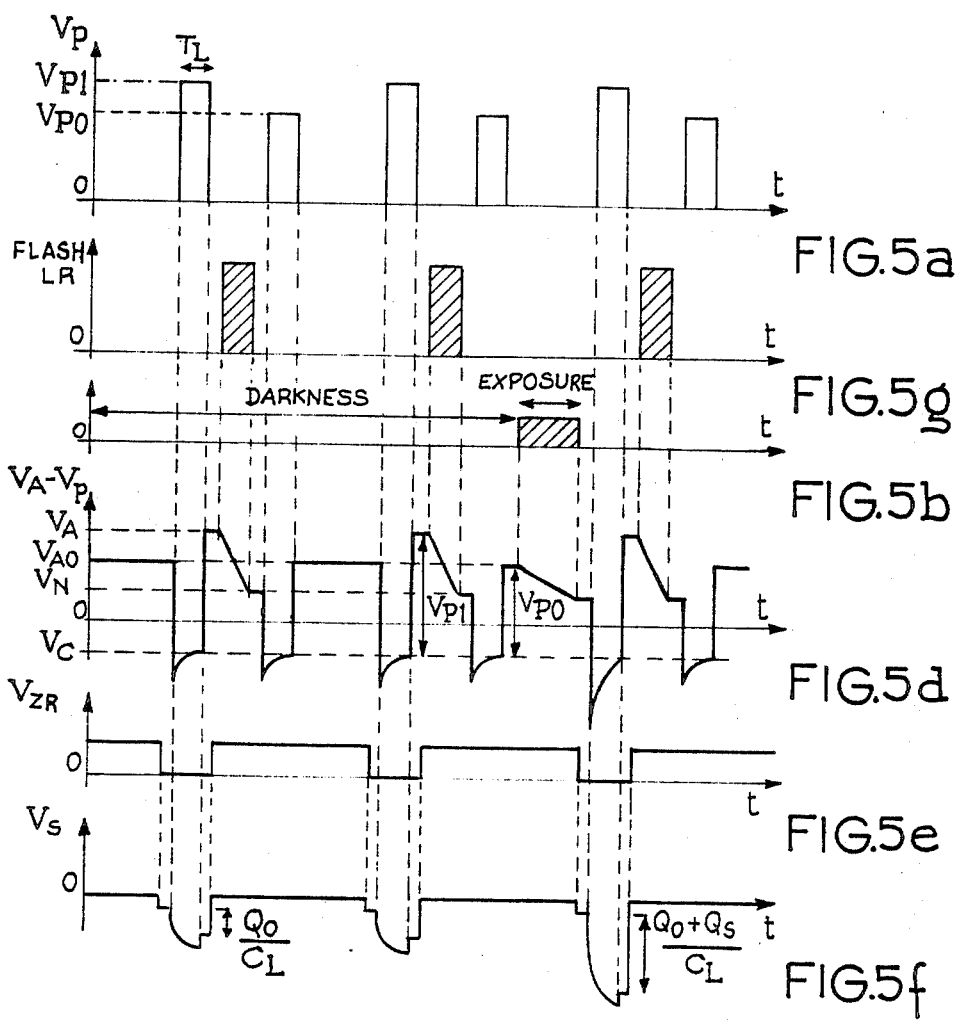
FIG. 3 shows the characteristic curve of the diode in which the diode current is represented as a function of its terminal voltage.
FIG. 4 is a signal diagram illustrating the variation in reading efficiency.
FIGS. 5a, 5b, 5d, 5e, 5f and 5g are signal diagrams providing an explanatory illustration of the method of reading in accordance with the invention and in a first alternative embodiment.
Figure 7A:
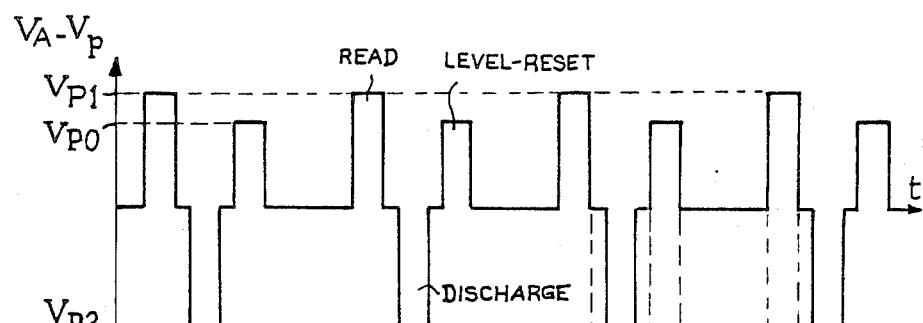
FIGS. 7a, 7b, 7d, 7e and 7f are signal diagrams providing an explanatory illustration of the method of reading in accordance with the invention and in a third alternative embodiment.
Figure 7B:
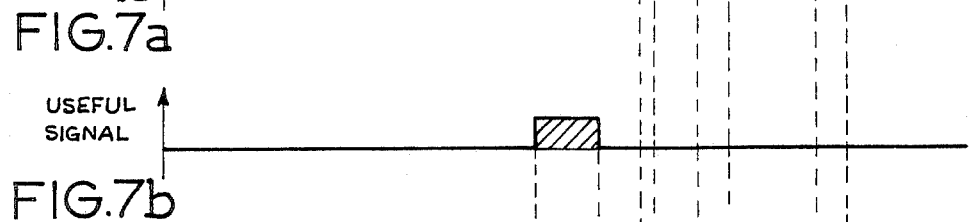
Figure 7D:
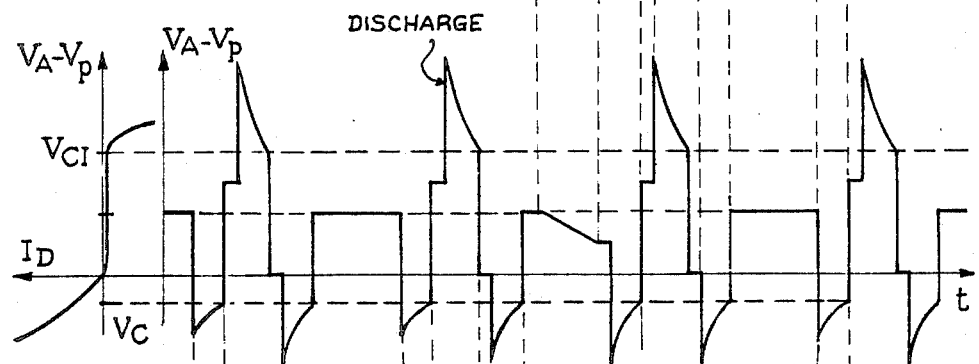
Figure 7E:
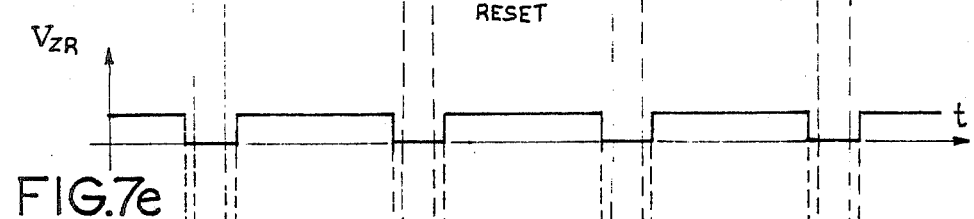
Figure 7F:
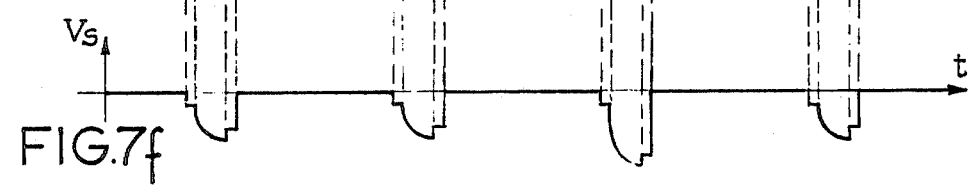

FIG. 3 shows the characteristic curve of the diode, in which the diode current $I_D$ is represented as a function of the voltage applied to its terminals, with its knee voltage $V_C$ and its reverse knee voltage $V_{CI}$.

The charge of the capacitor is a function of the current $I_D$ which is variable with the starting voltage $V_p - V_A$ at the moment of application of the pulse to the node P. Evaluation of the final charge of capacitor C at the end of the read time interval $T_L$ shows that this charge is a function of the duration of the read pulse $T_L$ and of the initial voltage at the capacitor terminals.

If the photodiode is maintained in darkness as shown in FIG. 2b during the first two integration cycles of duration $T_i$, the capacitor C is periodically recharged from $V_{AO}$ to $V_{ATL}$ as long as the current is not modified.

When a light pulse as shown in FIG. 2b is applied, the voltage $V_A$ at the node A decreases by reason of the fact that the mean photon current rises during this pulse and the initial voltage at the start of the next read pulse $V'_{AO}$ is lower than $V_{AO}$. The final voltage at the end of the read period $V'_{ATL}$ is different from the value which was obtained in the absence of a light signal. A certain fraction of the charge of the capacitor is not read, thus resulting in a reading "inefficiency" $\epsilon$:

$$\epsilon = \frac{V'_{ATL} - V_{ATL}}{V'_{AO} - V_{AO}},$$

which it is possible to evaluate as a function of the diode characteristics, of the value of the capacitor C and of the read time $T_L$. It is shown by experience and confirmed by calculation that, if the read time is very short with respect to a given signal at constant current, the reading efficiency is very low and if, on the contrary, the read time increases, the reading efficiency also increases to an ultimate point at which the value of the final voltage $V_{ATL}$ on the capacitor C is independent of the initial voltage $V_{AO}$ at the instant of the read pulse. If the voltage rises, the mean current is higher and the read time can be shortened in order to ensure suitable reading. In FIG. 2d, the full line shows an incomplete read during the third read pulse and dashed lines show two complete read operations, one read operation (1) being performed over a longer time interval $T'_L$ while the other read operation (2) is performed with a higher voltage and therefore a higher current.

In other words, with respect to a given read time, there exists a critical voltage equal to the knee voltage of the diode D, $$V_C = \frac{k \cdot T}{q} \mathrm{Log} \frac{kT}{q} \frac{C}{I_O \cdot T_L}$$

where k is the Boltzmann constant, T is the absolute temperature, q is the charge of the electron, and $I_O$ is the diode saturation current. The read pulse must extend fairly substantially beyond $V_C$ in order to obtain good reading efficiency. In this case, the voltage at the node A at the end of the read pulse is the amplitude of this pulse reduced by the knee voltage. The initial voltage at the diode terminals prior to application of the read pulse must therefore have a value such that the maximum illumination alone does not bring the diode to its conduction region and that, at the same time, the read pulse reliably brings the diode to its conduction region even in the absence of illumination.

Hence the need to superimpose a "charge background" $Q_O$ on the signal in order to obtain suitable reading efficiency in the presence of small signals. This charge background or biasing charge can be introduced either by means of a shift voltage for level-resetting or by means of an illumination which also results in level-resetting.

FIGS. 5a, 5b, 5d, 5e, 5f and 5g represent a first alternative mode of level-resetting. The reference letters of the figures correspond to those given in FIGS. 2a and following, FIG. 5g being a supplementary figure representing level-resetting light pulses FLASH-LR. In these figures and in the following figures, the voltage $V_A$ has been omitted and the variation $\Delta V_A$ has not been considered since the value of capacitance $C_D$ is much lower than C. After reading of the biasing charge, the voltage at the diode terminals is increased by the quantity of charges which has been read:

$$V_A = V_{AO} + \frac{Q_O}{C}.$$

The diode is therefore reverse-biased more strongly than before the read operation. The function of the level-resetting light pulse is to restore the initial potential level $V_{AO}$ at the terminals of the diode. In this first alternative embodiment, the light pulse has high intensity and discharges the diode to any desired potential $V_N$ on the condition that the value of this latter is appreciably lower than $V_{AO}$. A blank read operation is then performed by means of a pulse $V_P$ having an amplitude $V_{PO}$ which is smaller than $V_{P1}$. During this pseudo read, the integrator amplifier remains short-circuited by means of the voltage $V_{ZR}$ and does not deliver any signal. The amplitude $V_{PO}$ restores, after reading, the initial value of the voltage at the diode terminals $V_{AO} = V_{PO} + V_C$ ($V_C$ negative). The difference in amplitude between $V_{P1}$ and $V_{PO}$ defines the biasing charge $Q_O = C(V_{P1} - V_{PO})$. Thus a level-resetting sequence is inserted between the exposure and read sequences and restores the biasing charge $Q_O$.

FIGS. 6a, 6b, 6d, 6e and 6f represent the same signals as in FIG. 5 with level-resetting by means of uniform illumination which is calibrated both in time-duration d and intensity I. The corresponding figures bear the same reference letters as in FIGS. 5a and following. Each level-resetting light flash designated by the reference FLASH-LR always restores the voltage at the diode terminals to the same value $V_{AO}$, not only when the light-sensitive element has not been illuminated but also when it has been subjected to useful illumination.

In this alternative embodiment, it serves no useful purpose to perform a "blank" read operation and there are no longer any "blank" read pulses of amplitude $V_{PO}$. The biasing charge $Q_O$ is restored at the end of the calibrated level-resetting light pulse.

A "level reset" by a light flash having a duration of the order of 1 ms prior to each read operation is the preferred method, in particular when the light-sensitive elements are isolated elementary points since there is no problem of uniformity for the radiation and the sole requirement involves overstepping of the knee voltage $V_C$ and reliable return to this value.

The "level-resetting" operation represented in FIGS. 7a, 7b, 7d, 7e, 7f by a biasing pulse prior to each read operation and involving the reverse knee voltage of the diode is slightly more difficult to apply in practice since the diode avalanche points must not be too highly dispersed when the diodes are arranged in a matrix array in order to ensure that the control signals applied to the light-sensitive elements are suitable for all the elements. Dispersion of the avalanche voltage over a range of 8 to 10 V is unacceptable. On the other hand, this range is only of the order of 1 V for all the diodes of the matrix array and the method of level-resetting by means of biasing pulses can accordingly be employed. This method consists in applying to the node P a negative pulse having an amplitude $V_{P2}$ which will discharge the capacitor C, the terminal voltage of the diode being brought by said pulse to a point beyond its reverse knee voltage $V_{CI}$. The discharge restores the voltage to said reverse knee voltage $V_{CI}$ and a calibrated blank-read pulse having an amplitude $V_{PO}$ forward-biases the diode and thus brings the voltage to $V_C$, then to $V_{AO}$ by means of the trailing edge of said read pulse.

In FIG. 4, the reading "inefficiency" $\epsilon$ is plotted as a function of the initial forward voltage $(V_p - V_A)_O$ at the terminals of a given diode with respect to different read pulse time-durations $T_L = 1$ ms, $T_L = 100$ μs and $T_L = 10$ μs. This diagram shows by way of example that it is necessary to exceed the knee voltage (designated by a point on each curve) by 100 mV in order to limit the reading inefficiency to the order of 1 percent and to exceed said knee voltage by 200 mV in order to limit the inefficiency to approximately 5/10,000.

It is known in addition that, in order to obtain a low-noise read, the output voltage prior to arrival of the useful signal has to be subtracted from the output voltage after arrival of the useful signal. This accordingly makes it necessary to carry out a "double sampling" operation for reading the output voltage $V_s$ of the integrator.

The invention is not limited to the alternative embodiments of the method as specifically described in the foregoing. Thus any alternative embodiments within the capacity of those versed in the art and permitting the achievement of level-resetting as described in the foregoing accordingly remain within the scope of the invention.

What is claimed is:

1. A method for reading a quantity of charge produced by illumination of a photodetective element, said photodetective element comprising a photodiode in series with an associated capacitor, said capacitor and photodiode connected to a common node, said photodiode having a forward threshold voltage beyond which it is conductive in a forward direction, in which said photodiode is reverse biased during illumination and may be forward biased by means of periodic reading pulses, wherein, after each periodic read pulse, a constant biasing charge background is applied to said common node, said constant biasing charge background being such that during a next read pulse the photodiode is forward biased beyond its threshold voltage even when illumination is at zero level, said constant biasing charge background being obtained by restoring to a predefined value, after each read pulse, a voltage across the diode.

2. A method according to claim 1, wherein said constant biasing charge background is applied by a level-resetting illumination flash which is transmitted to the photodiode after each read pulse.

3. A method according to claim 2, wherein the level-resetting illumination is calibrated in time-duration and in intensity, the voltage at the terminals of the photodiode being restored to said predefined value by the level-resetting flashes.

4. A method according to claim 2, wherein the level-resetting illumination is of high intensity and is followed by a blank read stage, said blank read stage comprising applying a calibrated read pulse which restores the potential at the terminals of the photodiode to said predefined value.

5. A method according to claim 1, wherein the constant biasing charge background is obtained by the steps of:
(a) strong reverse-biasing the photodiode in order to exceed the reverse threshold voltage of said photodiode and to discharge the associated capacitor to said reverse threshold voltage, and
(b) level-resetting said photodiode by means of a calibrated read pulse.

* * * * *